(12) United States Patent
Staker et al.

(10) Patent No.: US 7,049,670 B2
(45) Date of Patent: May 23, 2006

(54) ELECTRO CERAMIC COMPONENTS

(75) Inventors: Bryan P. Staker, Pleasanton, CA (US); Douglas L. Teeter, Mountain View, CA (US); Eric L. Bogatin, Olathe, KS (US)

(73) Assignee: Glimmerglass Networks, Inc., Hayward, CA (US)

( * ) Notice: Subject to any disclaimer, the term of this patent is extended or adjusted under 35 U.S.C. 154(b) by 662 days.

(21) Appl. No.: 09/919,038

(22) Filed: Jul. 30, 2001

(65) Prior Publication Data
US 2003/0022423 A1    Jan. 30, 2003

(51) Int. Cl.
*H01L 27/14*    (2006.01)
(52) U.S. Cl. ................ 257/414; 257/499; 257/421
(58) Field of Classification Search ........ 257/410, 257/527, 531, 421, 414, 499, 506; 385/16, 385/18; 438/156
See application file for complete search history.

(56) References Cited
U.S. PATENT DOCUMENTS

| | | | |
|---|---|---|---|
| 5,962,949 A | 10/1999 | Dhuler et al. | |
| 6,124,663 A | 9/2000 | Haake et al. | |
| 6,480,645 B1 * | 11/2002 | Peale et al. | 385/18 |
| 6,509,816 B1 * | 1/2003 | Staker et al. | 335/78 |

* cited by examiner

Primary Examiner—Brad Smith
(74) Attorney, Agent, or Firm—Townsend and Townsend and Crew LLP

(57) ABSTRACT

An array apparatus has a micromachined SOI structure, such as a MEMS array, mounted directly on a class of insulative substrate, such as low temperature co-fired ceramic or a thermal-coefficient of expansion matched glass, in which is embedded electrostatic electrodes disposed in alignment with the individual MEMS elements, where the electrostatic electrodes are configured for substantial fanout. In a specific embodiment in order to compensate for differences in thermal-expansion characteristics between SOI and ceramic, a flexible mounting is effected by means of posts, bridges and/or mechanical elements which allow uneven expansion in x and y while maintaining z-axis stability. Methods according to the invention include fabrication steps wherein electrodes are fabricated to a post-fired ceramic substrate and coupled via traces through the ceramic substrate to driver modules.

12 Claims, 6 Drawing Sheets

ELECTRO CERAMIC COMPONENTS

BACKGROUND OF THE INVENTION

This invention relates to electro-ceramic components such as MEMS arrays and methods for fabricating electro ceramic components with high density interconnects and that maintain relative internal alignment. Components constructed according to the invention are MEMS arrays or other micromachined elements.

Conventional MEMS array structures comprise Silicon on Insulator (SOI) array structures in which is fabricated an integrated electrode array. One of the problems encountered is lack of scalability due to connector fan out limitations. A solution is needed. One possible solution might be found in array structures in development of XROS, Inc. of Sunnyvale, Calif.

XROS, Inc., in WIPO Publication WO 00013210 published Mar. 9, 2000, has disclosed elements of a hybrid structure for a MEMS array in which an SOI mirror or micromachined structure without electrodes is bonded to an unspecified insulating substrate on which is provided electrostatic electrodes for actuation of the mirror structure. The disclosure is silent about scaling of devices or about other provisions affecting operation in a thermally-stressed environment.

It has been discovered that the thermal coefficient of expansion mismatch between different components of an electro ceramic structure causes the structure to fall out of alignment, compromising the structure and the uniformity of operation of electrostatic actuators.

What is needed is a micromachined structure that can be scaled and be reliably manufactured and reliably operate over a range of temperature conditions.

SUMMARY OF THE INVENTION

According to the invention, an array apparatus has a micromachined SOI structure, such as a MEMS array, mounted directly on a class of substrate, such as low temperature co-fired ceramic, in which is embedded electrostatic electrodes disposed in alignment with the individual MEMS elements, where the electrostatic electrodes are configured for substantial fanout and the mounting allows for disparate expansion without degradation of performance. In a specific embodiment in order to compensate for differences in thermal-expansion characteristics between SOI and ceramic, a flexible mounting is effected by means of posts, bridges and/or mechanical elements which allow uneven expansion in x and y while maintaining z-axis stability.

Methods according to the invention include fabrication steps wherein electrodes are fabricated to a post-fired ceramic substrate and coupled via traces through the ceramic substrate to driver modules.

The invention will be better understood by reference to the following detailed description in connection with the accompanying illustrations.

DESCRIPTION OF SPECIFIC EMBODIMENTS

Figure 1:
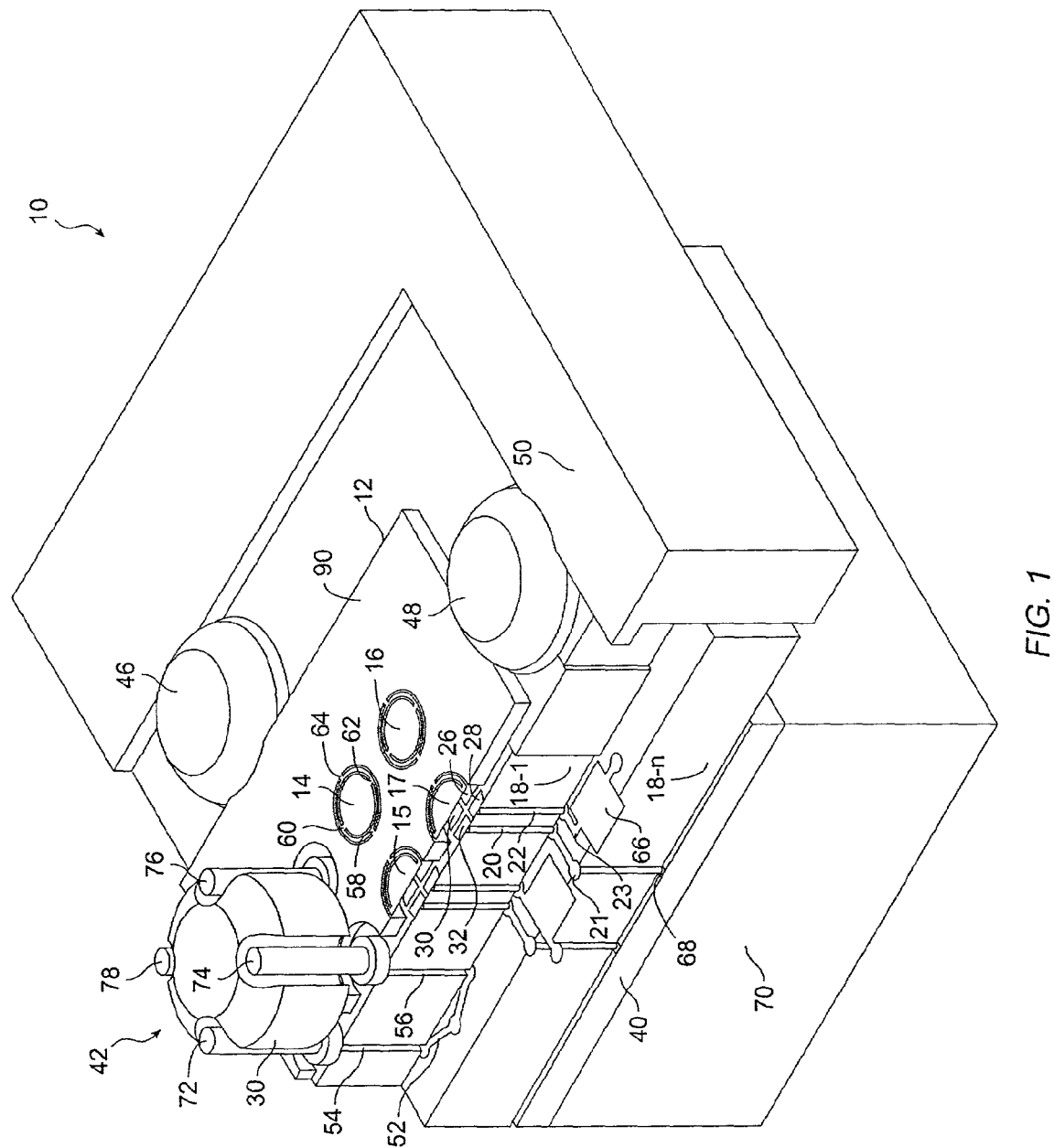
FIG. 1 is a perspective view of a first embodiment according to the invention.
Figure 2:
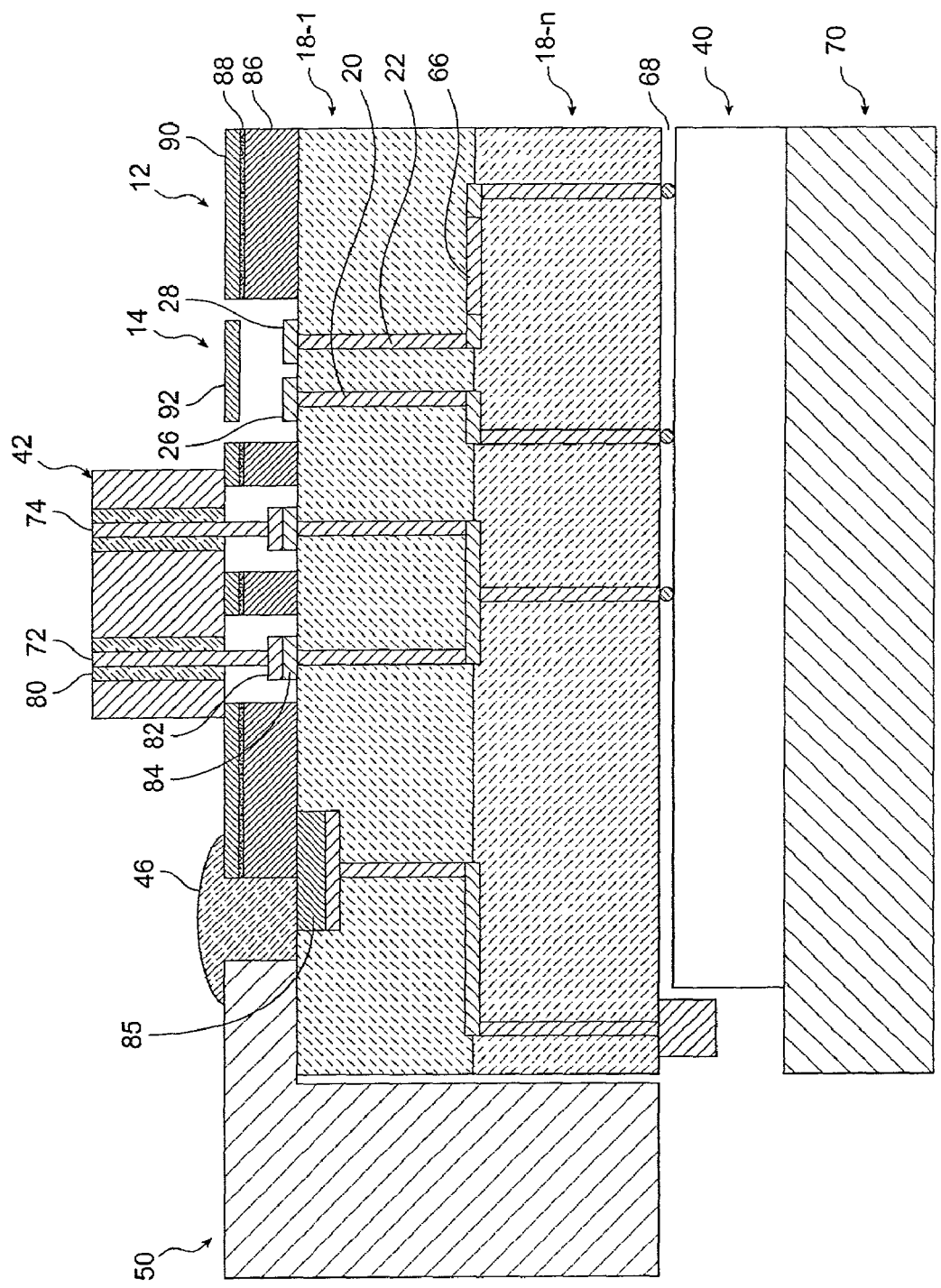
FIG. 2 is a side cross-sectional view of a single array element according to the first embodiment according to the invention.

Reference is made to FIG. 1 and FIG. 2 in which is shown a MEMS array module 10 according to the invention referred to generally as a MEMS Multichip Module. Its central feature is a silicon oxide wafer 12 into which is built MEMS-based mirrors 14–17. Preferably the wafer is a Silicon on Insulator structure mounted on a multilayer insulative structure 18-1 to 18-N. According to the invention, for each mirror there is an array of electrodes 26, 28, 30, 32 placed on the first insulative structure 18-1 with vias 20, 22 and traces 21, 23 through multiple layers 18-1 to 18-N to a control module 40. According to the invention, a clamping fastener 42 is placed at selected locations over the surface of the wafer 12. In addition, xy position locks 46, 48 are disposed at the boundaries of the wafer 12 to secure the wafer 12 to a frame 50. A mirror surface electrical connection 52 is coupled through vias 54, 56 to an external power source (not shown). Coupling to the connection 52 to the electrically conductive surface of the mirrors 14 is through four actuation elements 58, 60, 62, 64 around the perimeter of each mirror cavity. Components such as a resistor 66 may be buried in place along a trace for coupling electrodes to the control module 40 by direct attachments 68. A thermal control device 70, such as a heat sink or active thermal transfer element, is attached to the control module. An important feature of the invention is the provision of z clamping fasteners 42 which have various forms to restrain movement in the z-axis while permitting limited movement in the xy plane. To this end, pins 72, 74, 76, 78 are provided for each fastener 42 of the specific embodiment. The pins are held in place in the fastener by for example solder 80 which fill in shafts. The fastener 42 is a rigid, electrically conductive element. The pins 72, etc. each have a foot 82 that is bonded to the metallization 84. At the periphery of the wafer 12, an electrical contact to the bottom of the wafer is made through a mechanical connection 85. The wafer 12 comprises a conductive silicon layer 86, an insulative silicon oxide layer 88 and a conductive silicon structure 90, onto which is applied a metallized reflective surface 92, particularly in the mirror regions. According to the invention, the wafer 12 is not bonded to the underlying Low Temperature Co-fired Ceramic (LTCC) layer 18, except at fastening points along the edges, so that the wafer 12 is able to expand and contract laterally but not vertically relative to the LTCC layer 18.

Figure 3:
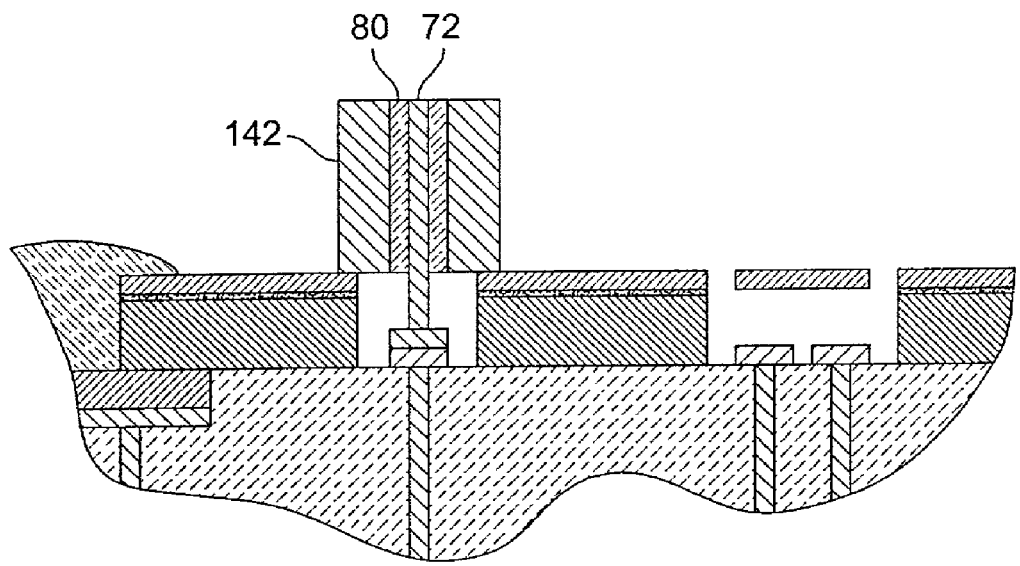
FIG. 3 is a side cross-sectional view of a single array element according to a second embodiment according to the invention showing an alternative attachment scheme.

Reference is made to FIG. 3. In this embodiment a clamping fastener 142 is provided in which only a single pin 72 is employed. This structure is more space efficient.

Figure 4:
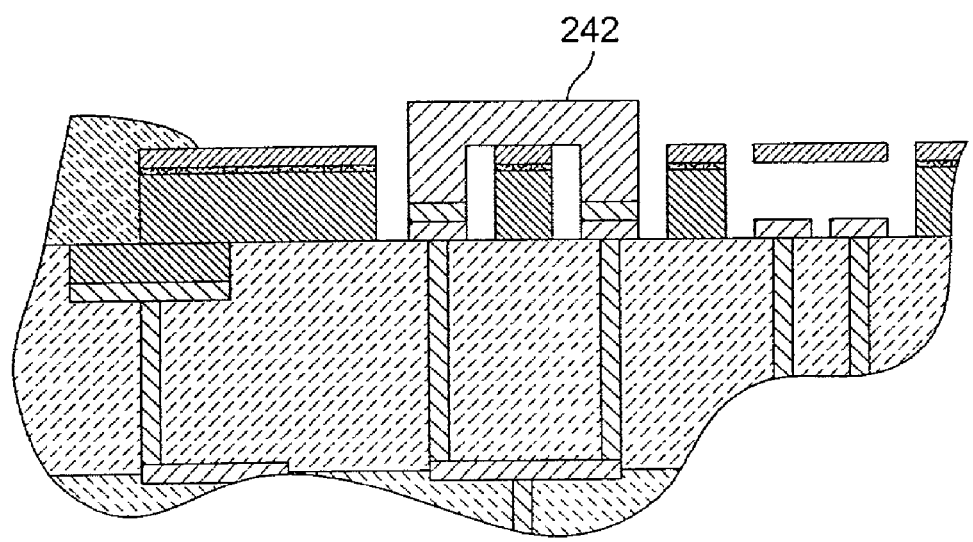
FIG. 4 is a side cross-sectional view of a single array element according to a third embodiment according to the invention showing an alternative attachment scheme.

Reference is made to FIG. 4 in which a monolithic bridge fastener 242 is provided. The bridge fastener 242 is attached to the insulative substrate through, for example solder or brazing.

Figure 5:
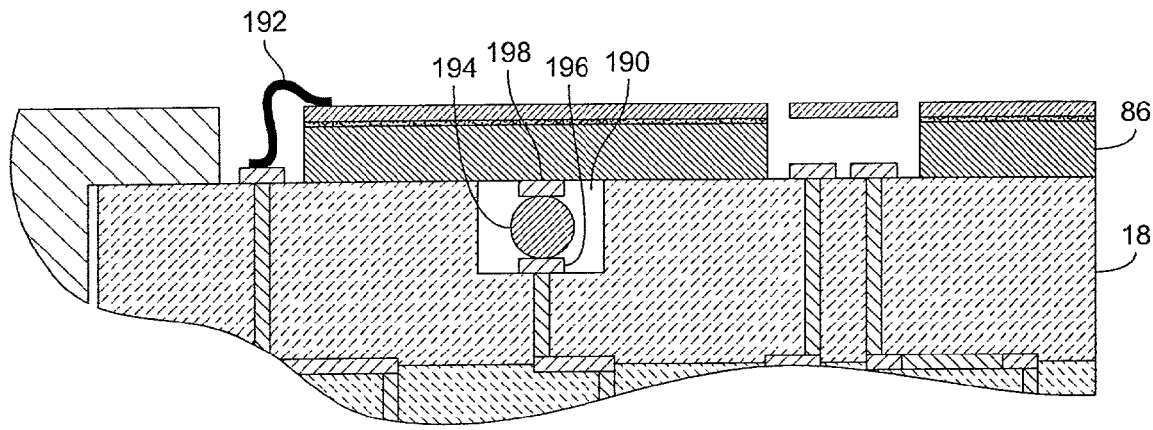
FIG. 5 is a side cross-sectional view of a single array element according to a fourth embodiment according to the invention showing an alternative attachment scheme.
Figure 6:
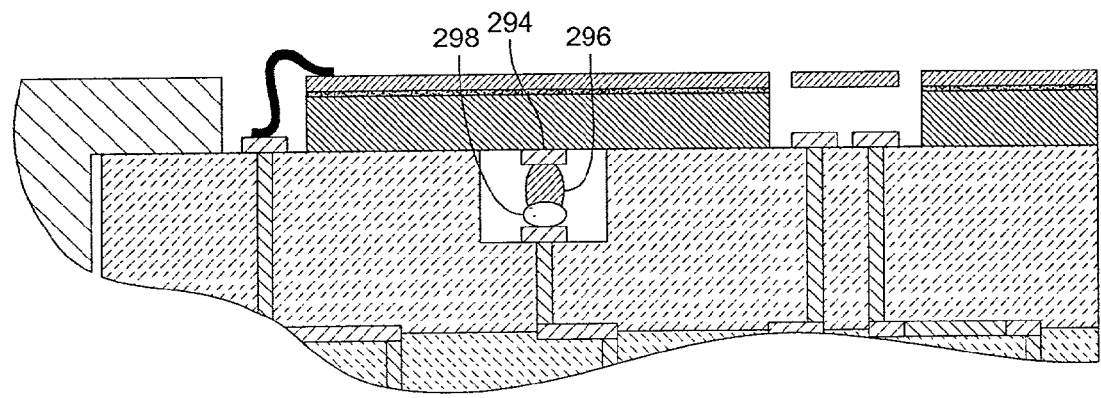
FIG. 6 is a side cross-sectional view of a single array element according to a fifth embodiment according to the invention showing an alternative attachment scheme.

Reference is made to FIG. 5 and FIG. 6 in which chip attach methods connect silicon 86 to the insulative substrate 18 within a cavity 190, making electrical contact to the bottom layer of the MEMS structure. Wire bond 192 makes an electrical connection to the top silicon surface. In FIG. 5, a solder ball 194 secured to upper and lower metallizations 196, 198 permits x and y movement and restrains vertical movement. Instead of a solder ball, a pair of gold stud bumps could be respectively bonded to the metallizations and fused to form a bond restraining z movement while allowing flexure in the xy plane.

In FIG. 6, a metal bump 296 is bonded to a metallization 294 on one side and to a conductive epoxy adhesive 298 on the other side to permit x and y movement and restrain vertical movement.

Figure 7:
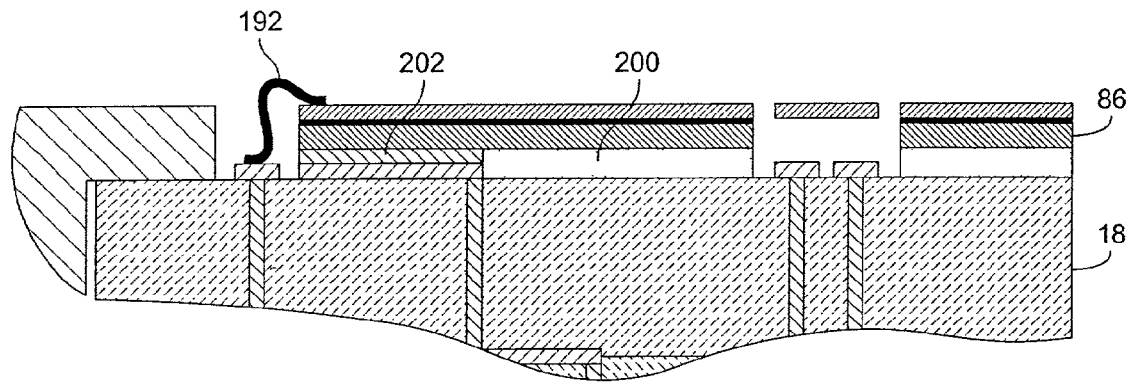
FIG. 7 is a side cross-sectional view of a single array element according to a sixth embodiment according to the invention showing an alternative attachment scheme.

Reference is made to FIG. 7. The silicon wafer 86 is attached to the substrate 18 with a non-conductive but flexible adhesive 200. Wire bond 192 makes electrical connection to the top silicon surface. A compliant conductive material 202 makes electrical connection to the bottom layer of the silicon layer 86.

Figure 8:
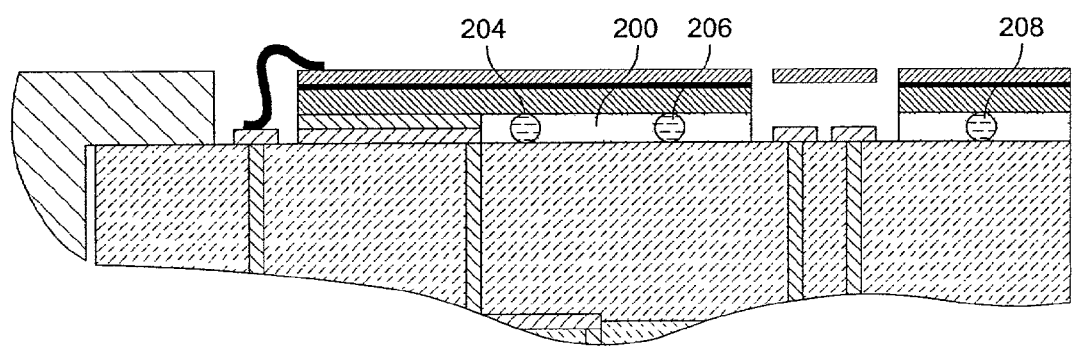
FIG. 8 is a side cross-sectional view of a single array element according to a seventh embodiment according to the invention showing an alternative attachment scheme.

Reference is made to FIG. 8. Precision spacers 204, 206, 208 are employed and embedded in the non-conductive adhesive 200 to establish height. These can be beads or bars, for example.

Figure 9:
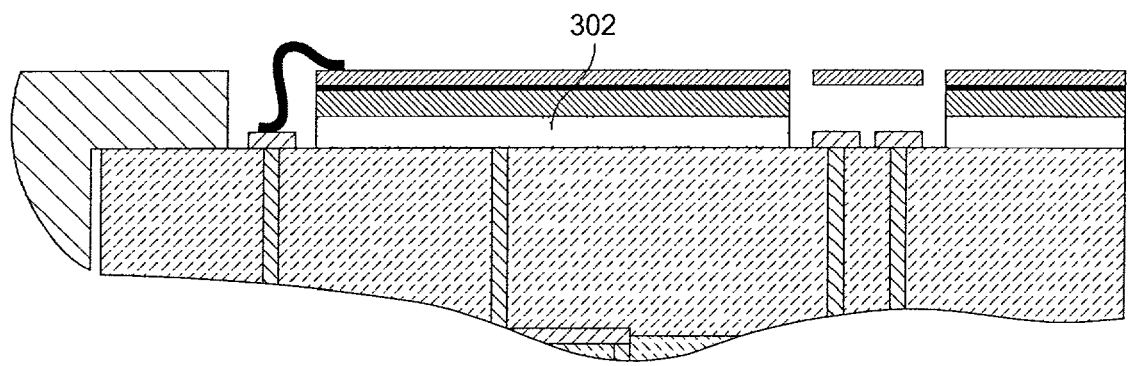
FIG. 9 is a side cross-sectional view of a single array element according to an eighth embodiment according to the invention showing an alternative attachment scheme.

Reference is made to FIG. 9. Similar to the embodiment of FIG. 7, herein an anisotropic conductive adhesive 302 is used instead of a non conductive adhesive, thus making the bottom layer an electrical connection.

Figure 10:
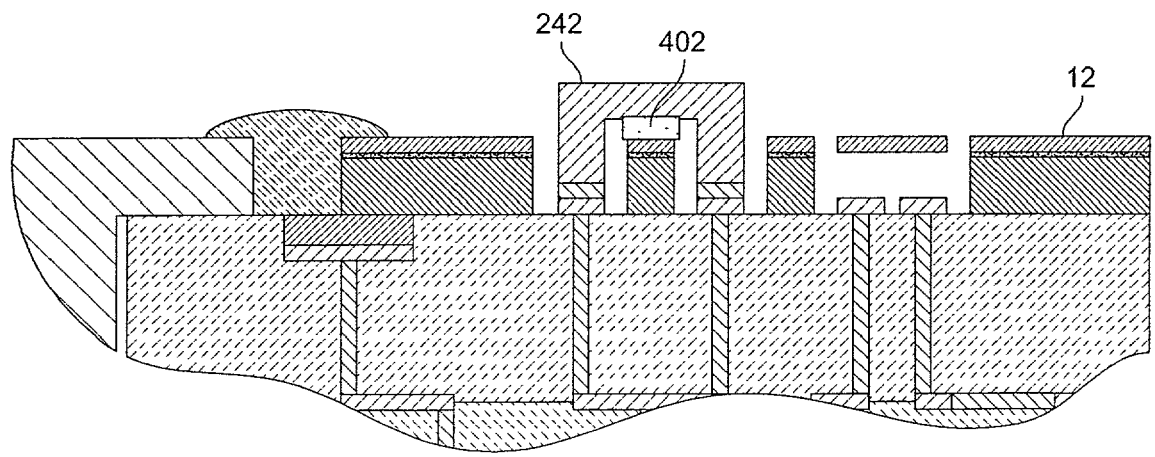
FIG. 10 is a side cross-sectional view of a single array element according to a ninth embodiment according to the invention showing an alternative attachment scheme.

Reference is made to FIG. 10. Similar to the embodiment of FIG. 4, but also applicable to embodiments of FIG. 2 and FIG. 3, a compliant conductive material 402 is placed as a washer or shim between the locking cap or bridge 242 and the wafer 12, wherever a cap or bridge is used.

In operation, electrodes 26, 28, 30, 32 placed directly on the substrate 18 actuate the mirrors 14 through electrostatic force. The present structure simplifies the fabrication and improves the fabrication yield of the mirror structures by eliminating the need for the electrodes to be included as part of the MEMS wafer 86 substrate. Because of this, larger mirror arrays become feasible.

Mounting the wafer or MEMS structure directly onto the mechanically robust LTCC layer or other printed circuit laminate (PCL) material (the "substrate") 18 reduces the stresses placed upon large MEMS structures. By using fasteners to clamp the MEMS structure to the substrate means that near zero height is added to the module and eliminate the possibility of delamination caused by thermal mismatch. Filling the gap between the edge of the MEMS structure and the substrate with a compliant material locks position of mirrors over electrodes. This method eliminates the need to rely on the shear strength of this material.

The invention has a number of structural advantages that permit scaling.

Direct chip attachment of the drive circuitry to the back of the substrate permits high density circuit fabrication. The substrate itself facilitates interconnection. This structure has resistors buried in the multilayer ceramic and thus the resistors are not inconveniently large and discrete.

Fabrication can take advantage of post-fire metallization and dielectric placement on ceramic, thus overcoming shrinkage issues associated with firing. The structures are also robust as compared to other structures. A variety of attachment combinations can now be employed:

Silicon to Ceramic board materials;
Silicon to Fiber/Ceramic matrix board materials;
Silicon to Polyimide materials;
Silicon to Flex circuit board materials;
Silicon wafer to Silicon substrate;
Silicon to Thick film on any substrate material;
Silicon to Thin film on any substrate material.

The invention has been explained with reference to specific embodiments. Other embodiments will be evident to those of ordinary skill in the art. Therefore, it is not intended that this invention be limited, except as indicated by the appended claims.

What is claimed is:

1. An array apparatus comprising:
   a micromachined structure having a plurality of actuatable elements;
   an insulative substrate; and
   electrostatic electrodes embedded in said insulative substrate and disposed in alignment with individual ones of said actuatable elements on a reverse side of said insulative substrate, said electrostatic electrodes coupled via traces through said insulative substrate.

2. The apparatus of claim 1 further having a driver module mounted to a reverse side of said insulative substrate and said micromachined structure being mounted directly on an obverse side of the insulative substrate.

3. An array apparatus comprising:
   a micromachined structure having a plurality of actuatable elements;
   an insulative substrate; and
   electrostatic electrodes embedded in said insulative substrate and disposed in alignment with individual ones of said actuatable elements on a reverse side of said insulative substrate, said micromachined structure and said insulative substrate having mismatched thermal-expansion characteristics, further including a flexible mounting and bias means which allow uneven expansion in x and y while maintaining z-axis stability.

4. The apparatus according to claim 3 wherein said micromachined structure is a silicon on insulator (SOI) and said insulative structure is a low-temperature co-fired ceramic (LTCC).

5. The apparatus according to claim 4 wherein said LTCC comprises a plurality of ceramic layers with electrical resistors buried between said layers and further including a driver module mounted on an obverse side of said insulative substrate and a heat extraction means juxtaposed to said driver module for drawing heat away from said insulative substrate.

6. The apparatus according to claim 3 wherein said flexible mounting and bias means further include bridge means between posts, said bridge means slidably confronting a reverse side of the micromachined structure.

7. The apparatus according to claim 3 wherein said insulative structure is a glass.

8. The apparatus according to claim 3 wherein current-limiting resistances are imbedded in the insulative structure in circuit paths between said electrodes and said driver module.

9. The apparatus according to claim 3 wherein the flexible mounting and bias means comprise posts of metal pins mounted to the insulative layer and each has a fixed cap confronting an reverse restraining surface of said micromachined structure, and a elastomeric element between juxtaposed obverse surfaces of said micromachined structure and said insulative structure.

10. The apparatus according to claim 3 wherein said micromachined structure is a MEMS array.

11. An array apparatus comprising:
a micromachined structure having a plurality of actuatable elements;
an insulative substrate; and
electrostatic electrodes embedded in said insulative substrate and disposed in alignment with individual ones of said actuatable elements on a reverse side of said insulative substrate, said electrostatic electrodes coupled via traces through said insulative substrate, further including a flexible mounting and bias means which allow uneven expansion in x and y while maintaining z-axis stability.

12. The apparatus of claim 1 further having a driver module mounted to a reverse side of said insulative substrate and said micromachined structure being mounted directly on an obverse side of the insulative substrate.

* * * * *